May 8, 1962 L. D. BROWN, JR 3,033,537
TRANSISTOR COOLER
Filed March 7, 1960

LAKE D. BROWN, JR.
INVENTOR.

BY Spensley and Horn

ATTORNEYS.

United States Patent Office 3,033,537

Patented May 8, 1962

3,033,537

TRANSISTOR COOLER

Lake D. Brown, Jr., Torrance, Calif., assignor to Pacific Semiconductors, Inc., Culver City, Calif., a corporation of Delaware

Filed Mar. 7, 1960, Ser. No. 13,075
2 Claims. (Cl. 257—263)

This invention pertains to cooling devices and more particularly to heat radiative mounting assemblies for transistors and other semiconductor devices.

The small physical size of semiconductor devices enables a significant decrease in the size and weight of many electronic components in which they are used and renders them particularly suitable for the miniaturization of electronic assemblies. However, because of the small size of semiconductor devices, their operation at higher power levels requires the use of auxiliary cooling means to remove heat from the semiconductor body, thereby tending to increase the size and cost of the electronic assembly. The cooling means currently in use in such applications are primarily heat radiative devices secured to or around the semiconductor device, and are usually either excessively large and costly or too small to be sufficiently effective. In addition, the semiconductor device cannot be quickly and easily separated from the bulkier heat radiative devices.

It is therefore an object of the present invention to provide a cooling means for transistors and other semiconductor devices.

A further object of the present invention is to provide a compact and efficient heat radiative mounting assembly for transistors and other semiconductor devices.

A still further object of the present invention is to provide a light-weight, inexpensive heat radiative mounting assembly for transistors and other semiconductor devices.

Yet a further object of the present invention is to provide a heat radiative mounting assembly for semiconductor devices, wherein the semiconductor device is easily detachable from the assembly.

The novel features which are believed to be characteristic of the invention, together with further objects and advantages thereof, will be better understood from the following description considered in connection with the accompanying drawing in which a presently preferred embodiment of the invention is illustrated by way of example. It is to be expressly understood, however, that the drawing is for the purpose of illustration and description only, and is not intended as a definition of the limits of the invention.

Figure 1:
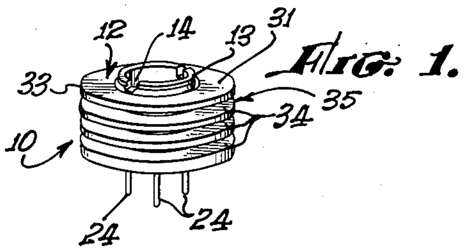
FIGURE 1 shows, in perspective, the preferred embodiment of a heat radiative mounting assembly in accordance with the present invention.
Figure 2:
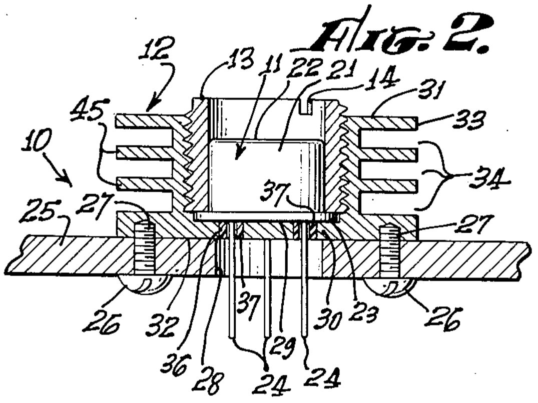
FIGURE 2 is a cross-sectional view of the device shown in FIGURE 1, mounted upon a metallic surface.
Figure 3:
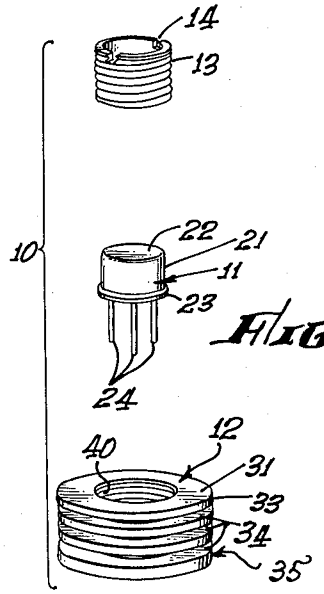
FIGURE 3 is an exploded view of the assembly shown in FIGURE 1.

With reference to the drawing, the heat radiative mounting assembly of the present invention is generally indicated by the reference numeral 10, and is illustrated as being used with a transistor housed within a metal case 11. The transistor case includes a generally cylindrical body 21 with a top surface 22 and a bottom surface 29 (see FIGURE 2). A circular peripheral flange 23 extends outwardly from the bottom surface, and electrical leads 24 project downwardly from the bottom surface 29.

The main portion of the heat dissipation assembly in accordance with the presently preferred embodiment of this invention includes a cylindrical body 12, of metal or other suitable heat conductive material, having upper and lower end surfaces 31 and 32 respectively and a peripheral wall surface 33 in which there is cut a plurality of circumferential, generally horizontal slots 34 of such depth and spacing to form effective cooling fins 45.

The heat conductive body 12 has a cylindrical, generally vertical central recess 40 extending from the upper surface 31 to within a short distance of the bottom surface 29 to define bottom wall 30. An inner surface of wall 35 defines the recess 40 and is female threaded to receive another part of the assembly hereinafter to be described. The diameter of the cylindrical recess 40 in the heat conductive body 12 is slightly greater than the diameter of the circular flange 23 of the transistor case 11 to allow insertion thereof therewithin.

Three cylindrical substantially vertical passages 36 are defined through the bottom wall 30 and disposed in alignment with the electrical leads 24 projecting from the bottom surface of the transistor case 11. The diameter of the passages 36 is substantially greater than the diameter of the electrical leads 24 to allow placement therein of tubular insulating elements 37 to prevent electrical contact between the leads 24 and the heat conductive body 12. The device 11 is inserted within the cylindrical recess 40 in the heat conductive body 12, with its flange 23 in contact with the upper surface of the bottom wall 30 of the cylindrical recess 40. Thus, the electrical leads 24 project through the passages 36 and are insulated therefrom by the insulating tubing 37. The transistor 11 is rigidly retained in the cylindrical recess by a cylindrical tubular retaining element 13 such as a bushing, also of an efficient heat conducting material. Element 13 is threaded into the cylindrical recess to urge the peripheral flange 23 of the transistor case 11 against the base of the recess in the heat conductive body 12. The inside diameter of the tubular retaining element 13 is only slightly greater than the outside body diameter of the transistor 11 to provide effective heat transfer from the semiconductor device 11 to the heat conductive body 12. Diametrically opposite slots 14 are cut into the upper edge surface of the retaining element 13 to provide a means for application of a rotative force to thread the element 13 into and out of the recess 40. The length of the element 13 is preferably sufficiently greater than the depth of the recess into which it is threaded to insure that the slots will be exposed above the upper end surface 31 of the body 12, so that the retaining element 13 can be conveniently removed by using a screwdriver or the edge of a coin.

The entire assembly 10 is fastened to a chassis 25, heat sink, or other suitable supporting structure, by screws 26 passing through the chassis 25 and threaded into tapped holes 27 in the lower end surface of the heat conductive body 12, the electrical leads 24 passing through a suitable hole 28 provided in the chassis 25.

Heat generated during high power operation of the transistor 11 is transferred to heat conductive body 12 from whence it is dissipated primarily by radiation through the cooling fins 45. More heat can be removed by forced-air cooling of the heat conductive body 12 and by conduction from the lower end surface 32 of the body 12 to a heat sink. Generated heat is efficiently transferred to the heat conductive body 12 since the body 12 is in contact with the greater part of the bottom surface of the semiconductor device 11 and since the body 12, in conjunction with the retaining element 13, closely encircles the body of the semiconductor device 11.

Without intending to limit the present invention exemplary dimensions of the present invention assembly for use with a J.E.D.E.C. TO–16 transistor housing is as follows: The length of the leads from the bottom of the case is 0.500″ minimum, the overall height of the case, excluding the leads is from .200 to .260" and the case outside diameter is between 0.2900 and 0.370".

Although the invention has been described with a certain degree of particularity, it is to be understood that the present disclosure has been made only by way of example and that numerous changes in the details of construction and the combination and arrangement of parts may be resorted to without departing from the spirit and the scope of the invention as hereinafter claimed. For example, semiconductors of different and irregular shapes (including various polygonal shapes) could be accommodated by using a suitable snap-ring type device well known in the art to replace the threaded retaining element 13, and cases without flanges could be retained by a threaded cap device to exert force on the top surface of the semiconductor. In addition, one large hole could provide for passage of the electrical leads of the semiconductor device through the heat conductive body, without the necessity for insertion of insulating material.

What is claimed is:

1. A semiconductor device assembly comprising: a semiconductor device enclosed within a device case, said device case having a cylindrical body with top and bottom surfaces, a circular peripheral flange adjacent said bottom surface, and electrical leads projecting from said bottom surface; a heat conductive body having upper and lower end surfaces and a peripheral wall surface, said peripheral wall surface defining a plurality of circumferential slots therein of such depth and spacing to form effective cooling fins, said heat conductive body having a substantially vertical cylindrical recess therein, said recess being defined by a threaded longitudinal wall extending into said body from said upper end surface to a base surface, the diameter of said recess being slightly greater than the diameter of said peripheral flange of said device case, said base surface having opening defining means for said leads therethrough, said device case being mated with said recess such that the substantial entirety of said bottom surface rests upon said base surface and said electrical leads project through said opening defining means in said base surface; and an externally threaded cylindrical tubular retaining element having an inside diameter substantially equal to but greater than the body diameter of said device case, the length of said retaining element being at least as great as the length of said device case, said retaining element being threadably encased into the cylindrical recess in said heat conductive body in bearing engagement with the upper surface of said peripheral flange.

2. A semiconductor device assembly comprising: a semiconductor device encased within a device case, said device case having a cylindrical body with top and bottom surfaces, a circular peripheral flange adjacent said bottom surface, and electrical leads projecting from said bottom surface; a cylindrical heat conductive body having upper and lower end surfaces and a peripheral wall surface, said peripheral wall surface defining a plurality of circumferential slots therein of such depth and spacing to form effective cooling fins, said heat conductive body defining a cylindrical recess therein with a threaded longitudinal wall extending into said body from said upper end surface to a base surface, said base surface defining a plurality of openings therethrough mateable with said electrical leads, said semiconductor device case being mated with said recess with substantially the entirety of said bottom surface in bearing contact with said base surface and with said electrical leads extending through the openings defined by said base surface; and an externally threaded cylindrical tubular retaining element mateable with the threads of said body, said retaining element having an inside diameter substantially equal to but greater than the body diameter of the cylindrical device case, the length of said retaining element being at least as great as the length of said semiconductor device, said retaining element being threadably mated within the cylindrical recess in said heat conductive body in bearing contact with the upper surface of said peripheral flange to urge said flange into bearing contact with said base surface.

References Cited in the file of this patent

UNITED STATES PATENTS

| | | |
|---|---|---|
| 1,306,175 | Dady | June 10, 1919 |
| 1,441,444 | Mitchell | Jan. 9, 1923 |
| 2,917,286 | Deakin | Dec. 15, 1959 |